US008183900B2

(12) United States Patent
Lamanna et al.

(10) Patent No.: US 8,183,900 B2
(45) Date of Patent: May 22, 2012

(54) CHARGE PUMP FOR A PHASE-LOCKED LOOP

(75) Inventors: Pasquale Lamanna, Villeneuve-Loubet (FR); Nicolas Sornin, La Tronche (FR)

(73) Assignee: Cambridge Silicon Radio Limited, Cambridge (GB)

( * ) Notice: Subject to any disclaimer, the term of this patent is extended or adjusted under 35 U.S.C. 154(b) by 72 days.

(21) Appl. No.: 12/918,451

(22) PCT Filed: Mar. 5, 2009

(86) PCT No.: PCT/EP2009/052632
§ 371 (c)(1),
(2), (4) Date: Sep. 23, 2010

(87) PCT Pub. No.: WO2009/109638
PCT Pub. Date: Sep. 11, 2009

(65) Prior Publication Data
US 2011/0204938 A1 Aug. 25, 2011

(30) Foreign Application Priority Data
Mar. 7, 2008 (GB) .................... 0804340.8

(51) Int. Cl.
*H03L 7/06* (2006.01)
(52) U.S. Cl. ........................................ 327/157; 327/148
(58) Field of Classification Search .................. 327/148, 327/157
See application file for complete search history.

(56) References Cited

U.S. PATENT DOCUMENTS 6,100,767 A * 8/2000 Sumi ............................. 331/11
7,248,086 B2 * 7/2007 Frans et al. .................. 327/147
(Continued)

FOREIGN PATENT DOCUMENTS
WO 02/076009 A 9/2002

OTHER PUBLICATIONS

Meninger et al., "A 1-MHz Bandwidth 3.6-GHz 0.18-um CMOS Fractional-N Synthesizer Utilizing a Hybrid PFD/DAC Structure for Reduced Broadband Phase Noise," IEEE Journal of Solid-State Circuits, Apr. 2006, pp. 966-980, vol. 41, No. 4, IEEE.

(Continued)

*Primary Examiner* — Lincoln Donovan
*Assistant Examiner* — Adam Houston
(74) *Attorney, Agent, or Firm* — Novak Druce DeLuca + Quigg LLP

(57) ABSTRACT

A charge pump circuit causes a current to flow either into or out of another circuit in dependence on a current output by first and second current paths, each including a current source and a current control device having two switched nodes, and a control node arranged to control a current flow between the first and second switched nodes. The charge pump further includes a capacitive element and a switching arrangement arranged such that, during a first time period, the capacitive element is in communication with a respective one of the current paths, whereby a current output by the first current path causes an electrical charge to be formed on a first capacitive plate and a current output by the second current path causes an electrical charge to be formed on a second capacitive plate, and during a second time period, the electrical charge formed on the first and second capacitive plates during the first time period is discharged to form a current at an output node.

26 Claims, 6 Drawing Sheets

U.S. PATENT DOCUMENTS

| | | | |
|---|---|---|---|
| 7,352,249 B2 * | 4/2008 | Balboni et al. | 331/16 |
| 8,089,307 B2 * | 1/2012 | Lamanna et al. | 327/157 |
| 2004/0232960 A1 * | 11/2004 | Albasini et al. | 327/156 |
| 2005/0094757 A1 | 5/2005 | Meninger et al. | |
| 2005/0248413 A1 * | 11/2005 | Zhu et al. | 331/17 |
| 2007/0183175 A1 | 8/2007 | Sakiyama et al. | |
| 2008/0191783 A1 * | 8/2008 | Sudjian et al. | 327/536 |
| 2009/0115498 A1 * | 5/2009 | Al-Shamma et al. | 327/536 |
| 2009/0256602 A1 * | 10/2009 | Liu | 327/157 |
| 2011/0012652 A1 * | 1/2011 | Lamanna et al. | 327/156 |
| 2011/0025386 A1 * | 2/2011 | Lamanna et al. | 327/156 |
| 2011/0025387 A1 * | 2/2011 | Lamanna et al. | 327/157 |
| 2011/0025388 A1 * | 2/2011 | Lamanna et al. | 327/157 |
| 2011/0204938 A1 * | 8/2011 | Lamanna et al. | 327/157 |

OTHER PUBLICATIONS

Koo et al., "A Fully Integrated CMOS Frequency Synthesizer With Charge-Averaging Charge Pump and Dual-Path Loop Filter for PCS- and Cellular-CDMA Wireless Systems," IEEE Journal of Solid-State Circuits, May 2002, pp. 536-542, vol. 37, No. 5, IEEE.

Cassia et al, "Analytical Model and Behavioral Simulation Approach for a Pi Delta Fractional-N Synthesizer Employing a Sample-Hold Element," IEEE Transactions on Circuits and Systems—II: Analog and Digital Signal Processing, Nov. 2003, pp. 850-859, vol. 50, No. 11, IEEE.

* cited by examiner

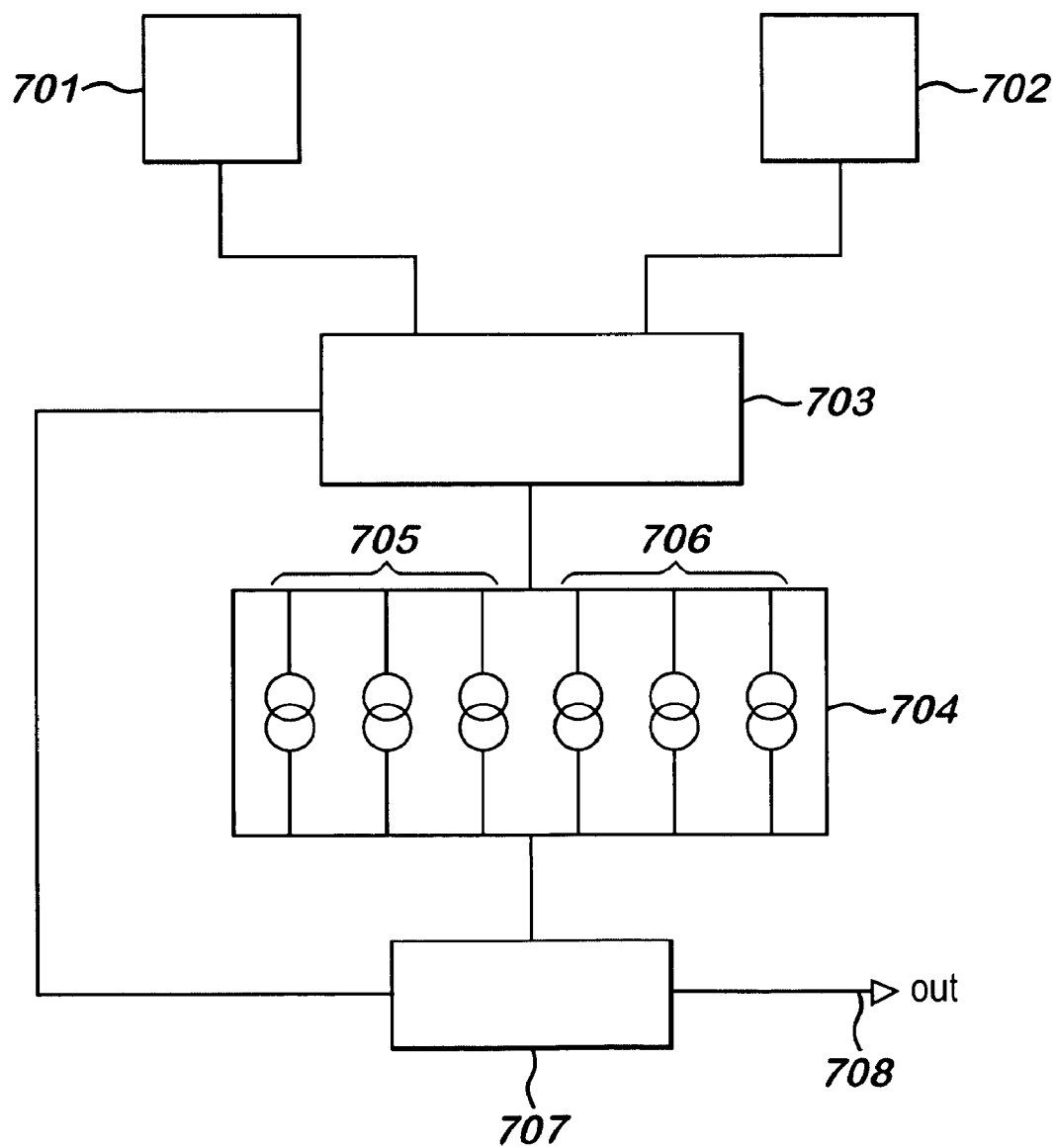

CHARGE PUMP FOR A PHASE-LOCKED LOOP

The invention relates to a charge pump and specifically to a charge pump for a phase-locked loop.

Figure 1:
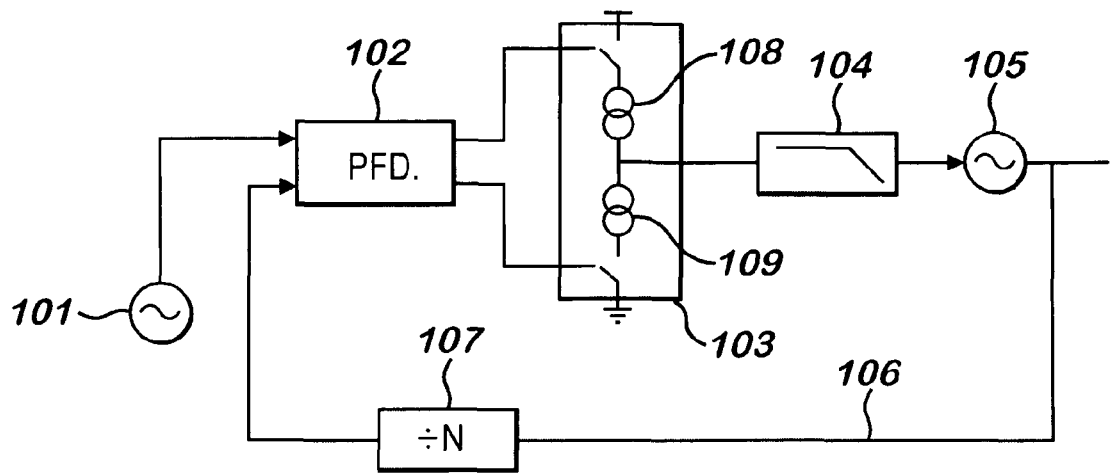

A phase-locked loop is a circuit that generates an output signal having a predetermined frequency and/or phase relationship with a reference signal. A typical phase-locked loop is shown in FIG. 1. The phase-locked loop comprises an oscillator 101 for generating a signal of fixed frequency and a phase/frequency detector (PFD) for comparing the fixed frequency signal (the reference signal) with a feedback signal output by a divider 107 that is located in feedback loop 106. The PFD is connected to a charge pump 103. The PFD outputs a signal to the charge pump that is representative of the phase and/or frequency difference between the feedback signal and the reference signal. The charge pump injects a current into a loop filter 104 in dependence on the signal it receives from the PFD. Typically, this current injection will take the form of either an "up" or "down" current generated by current sources 108 and 109 respectively, so that current flows either into or out of the loop filter. In other words, the PFD and charge pump act together to output either positive or negative charge "pulses" in dependence on whether the reference signal's phase leads or lags the feedback signal. The loop filter filters these charge pulses to generate a control signal for a signal generator 105.

The signal generator is typically a voltage-controlled oscillator (VCO) controlled by a tuning voltage at its control input. The loop filter is typically arranged to integrate the current pulses it receives from the charge pump to generate the tuning voltage necessary for controlling the VCO. If the feedback signal lags the reference signal, it is necessary to speed up the VCO. Conversely, if the feedback signal leads the reference signal, it is necessary to slow down the VCO.

The frequency of the signal output by the phase-locked loop can be changed by varying the frequency of the reference signal. Often, the reference signal is generated by a very stable oscillator whose frequency cannot be varied.

Therefore, it can be beneficial to include a divider in the feedback loop so that the output frequency of the phase-locked loop can be varied without having to change the frequency of the reference signal. In FIG. 1, this divider is shown at 107. if the divide ratio is a constant N, then the loop forces the output signal to be exactly N times the reference signal frequency. In circuits of this type the divide ratio N can be changed in integer steps to change the frequency of the signal generator.

One limitation with this type of phase-locked loop is that the output frequency cannot be varied in steps any smaller than the reference frequency. This is because N can only have integer values, so that the smallest change in the output frequency that can be made is $1 \times F_{REF}$. Therefore, for fine frequency resolution, it is preferred to have a small reference frequency. However, due to mismatches in the phase-locked loop's charge pump and other factors such as the non-ideal behaviour of the PFDs, the charge pump tends to output small charge pulses that cause sidebands to appear in the output signal of the VCO, even when the phase-locked loop is locked. These sidebands appear at offsets equal to the reference frequency. Therefore, if the reference frequency is small, a narrower loop filter bandwidth is required to remove the sidebands. Phase-locked loops with narrower loop filter bandwidths take longer to transition from one frequency to another and may not operate at the required speed. Also, the narrower the loop filter's bandwidth, the less the VCO's phase noise is suppressed.

Figure 2:
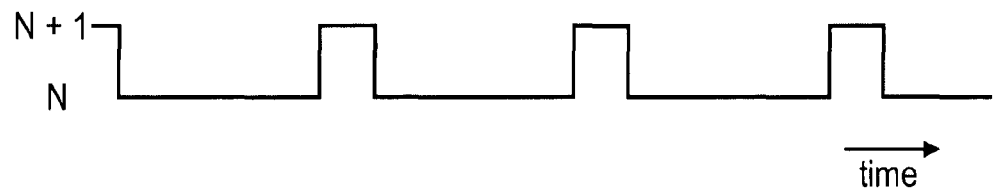

One way of achieving a lower reference frequency for an integer PLL is to put a 1/M divider between the reference signal and the PFD. Another solution is to use a fractional-N divider. Fractional-N synthesis involves varying the division ratio periodically between two integer values, as shown in FIG. 2. The overall division ratio is then determined by N plus a fractional value determined by the time for which a division ratio of N+1 is used relative to a whole time period (i.e. the time for which a division ratio of N is used plus the time for which a division ratio of N+1 is used).

Figure 3:
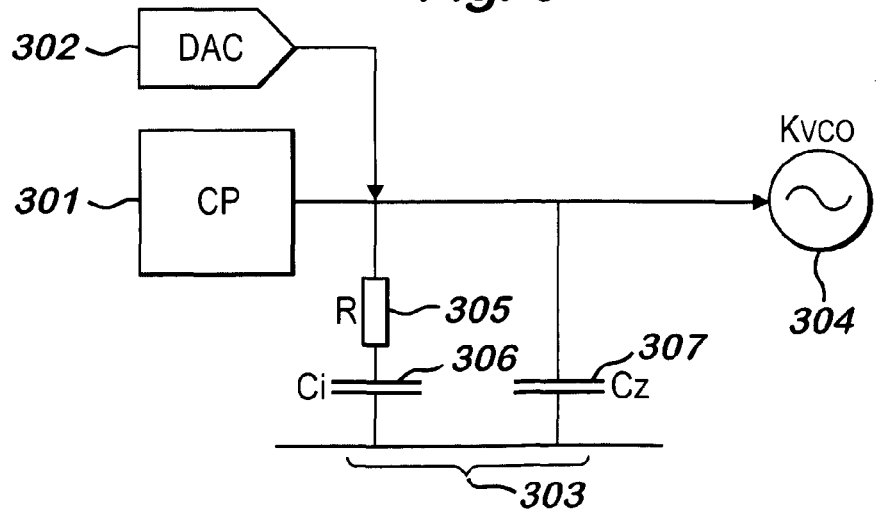

A problem with a fractional-N division architecture is that the modulation of the division ratio causes a huge transient voltage at the input to the VCO. To partially compensate for this effect, DAC compensation can be performed in parallel with the charge pump output. An example of a circuit using DAC compensation is shown in FIG. 3. FIG. 3 illustrates the PFD charge pump 301, the DAC charge pump 302, the loop filter 303 and the VCO 304. The deterministic jitter caused by the modulation of the division ratio is known in advance. The DAC charge pump typically generates a current that is the inverse of the error current caused by the modulation of the division ratio. This is then summed by the loop filter with the current output by the PFD charge pump.

The PFD charge pump outputs a constant current for a length of time that is dependent on the phase difference between the feedback signal and the reference signal, while the DAC charge pump outputs a current for a constant time but with a magnitude that is dependent on the deterministic jitter resulting from the modulation of the division ratio. Therefore, although by summing these two currents together in the loop filter it can be ensured that on average the amount of charge introduced into the system by deterministic jitter is compensated for, it does not suppress the transients that are an inherent part of the structure.

Figure 4:
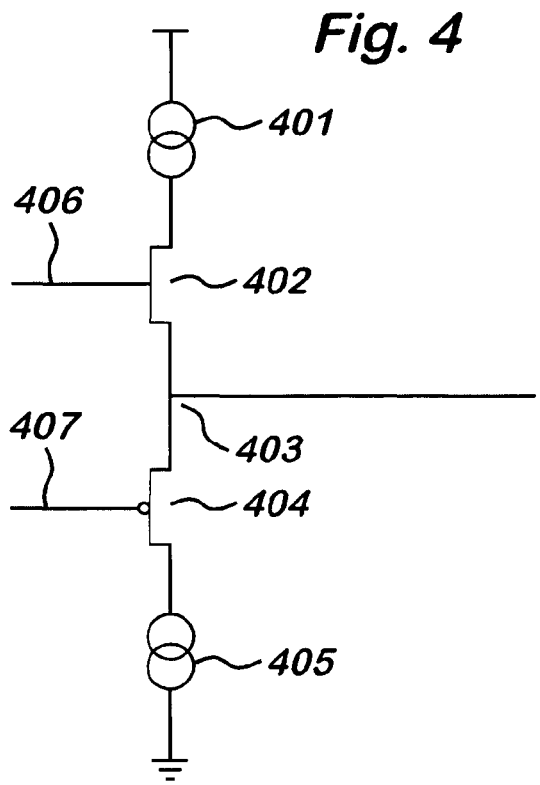

A typical charge pump is shown in FIG. 4. The charge pump comprises two current sources, 401 and 405 and two switches that are implemented by MOSFETs 402 and 404. The transistors are essentially voltage controlled switches so that the current that flows through the circuit can be controlled by controlling the voltage at the gates of the transistors. In FIG. 4, the transistors are each controlled via a control line 406, 407. The charge pulses generated by the charge pump are output at node 403. Typically the two transistors are of opposite polarity. In FIG. 4, transistor 402 is an NMOS transistor and transistor 404 is a PMOS transistor. Therefore, when its control line is raised high transistor 402 becomes conducting between its drain and source terminals. At the same time, transistor 404 is non-conducting between its drain and source terminals. Therefore, a current flows from current source 401 through transistor 402 and out of output node 403. Conversely, when its control line is taken low, transistor 402 is non-conducting between its drain and source terminals while transistor 405 becomes conducting. Therefore, a current flows into output node 403 and down through transistor 404 to current source 405 (which here is acting as a current sink). Therefore, the charge pump shown in FIG. 4 is able to generate the "up" and "down" currents that are required by a phase-locked loop.

The charge pump shown in FIG. 4 can thus be used to generate a constant current of variable duration (e.g. for PFD charge injection) by setting the control lines to be a predetermined voltage, corresponding to constant currents in either the "up" or "down" direction, for a length of time that is dependent on the phase-difference between the reference signal and the feedback signal. Similarly, the charge pump can be used to generate a variable current for a constant time (e.g. for DAC compensation) by varying the control voltage applied to the gates of the transistors and applying that voltage for a constant length of time.

A disadvantage of using transistors of opposite polarity in the charge pump of FIG. 4 is that different types of transistors tend to behave differently in response to a control voltage. It is possible to match transistors of different polarities reasonably closely in terms of their static behaviour. However, it is not possible to match the dynamic behaviour of two different types of transistor as they will always have different rise times. This can cause transient errors that propagate into the circuit following the charge pump (e.g. the loop filter of a phase-locked loop).

Therefore, there is a need for an improved charge pump in which the dynamic behaviour of the switching devices controlling the flow of the output current can be more closely matched.

According to a first embodiment of the invention, there is provided a charge pump circuit for connection to another circuit via an output node of the charge pump and for causing a current to flow either into or out of the other circuit via the output node in dependence on a current output by first and second current paths in the charge pump, each current path comprising a current source and a current control device having two switched nodes, one of which is arranged to receive a current from the current source, and a control node arranged to control a current flow between the two switched nodes in dependence on a voltage at the control node, the current control devices of the first and second paths being of the same type such that they are responsive to the same polarity of voltage at their control node to be conducting between their switched nodes, the charge pump further comprising a capacitive element having first and second capacitive plates and a switching arrangement arranged such that, during a first time period, the first and second capacitive plates are each in communication with a respective one of the current paths, whereby a current output by the first current path causes an electrical charge to be formed on the first capacitive plate and a current output by the second current path causes an electrical charge to be formed on the second capacitive plate, and during a second time period, the first and second capacitive plates are connected to a reference voltage and the output node respectively, the electrical charge formed on the first and second capacitive plates during the first time period thereby being discharged to form a current at the output node.

The capacitive element may be arranged such that, during the second time period, the electrical charge formed on the first capacitive plate discharges in one direction relative to the output node and the electrical charge formed on the second capacitive plate discharges in the opposite direction relative to the output node.

The capacitive element may be connected between the first and second current paths such that, during the first time period, a current output by the first current path causes a voltage change at the other of the switched nodes of the current control device of the first path that causes an electrical charge to form on the first capacitive plate and a current output by the second current path causes a voltage change at the other of the switched nodes of the current control device of the second path that causes an electrical charge to form on the second capacitive plate.

The capacitive element may be a capacitor arranged such that, during the first time period, one plate of the capacitor is connected to the other of the switched nodes of the current control device of the first current path and the other plate of the capacitor is connected to the other of the switched nodes of the current control device of the second current path.

The capacitive element may comprise two capacitive devices, one connected to the first current path and the other connected to the second current path such that, when a current is output by one of the current paths, it is received by the capacitive device connected to that current path and causes an electrical charge to form on a plate of that device.

The capacitive element may comprise a switch arranged such that, during the first time period, the capacitive devices are not connected to each other and, during the second time period, the capacitive devices are connected to each other.

The capacitive devices may be capacitors, each having one plate connected to the other of the switched nodes of the current control device of its respective current path and the other plate connected to a reference voltage.

The control nodes of the current control devices may be arranged to receive the same control signal.

The current control devices may be transistors and may be PMOS transistors.

According to a second embodiment of the invention, there is provided a phase-locked loop for generating an output signal of a predetermined frequency, the phase-locked loop comprising a charge pump arranged to generate a current in dependence on a phase difference between a signal output by the phase-locked loop and a reference signal, the charge pump being connected to a filter via an output node of the charge pump and being capable of causing a current to flow either into or out of the filter via the output node in dependence on a current output by first and second current paths in the charge pump, each current path comprising a current source and a current control device having two switched nodes, one of which is arranged to receive a current from the current source, and a control node arranged to control a current flow between the two switched nodes in dependence on a voltage at the control node, the current control devices of the first and second paths being of the same type such that they are responsive to the same polarity of voltage at their control node to be conducting between their switched nodes, the charge pump further comprising a capacitive element having first and second capacitive plates and a switching arrangement arranged such that, during a first time period, the first and second capacitive plates are each in communication with a respective one of the current paths, whereby a current output by the first current path causes an electrical charge to be formed on the first capacitive plate and a current output by the second current path causes an electrical charge to be formed on the second capacitive plate, and during a second time period, the first and second capacitive plates are connected to a reference voltage and the output node respectively, the electrical charge formed on the first and second capacitive plates during the first time period thereby being discharged to form a current flow at the output node.

The phase-locked loop may comprise a control unit arranged to control a current output by the first and second current paths by controlling a voltage at the control node of the current control device of each current path.

The control unit may be arranged to cause a current path to output a current by controlling the voltage at the control node of the current control device of that path to be a voltage at which the current control device of that current path is conducting between its switched nodes.

The control means may be arranged to control a length of time for which a current path outputs a current by controlling the length of time for which the voltage at the control node of the current control device of that current path is a voltage at which the current control device is conducting.

The phase-locked loop may comprise a feedback loop arranged to form a feedback signal representative of the output signal for comparison with the reference signal, said feedback loop comprising a divider arranged to receive the output signal of the phase-locked loop and divide the output signal to form the feedback signal, the divider being arranged to vary the divisor by which the output signal is divided.

The charge pump may be arranged to perform a two-part compensation process during the first time period, the control unit being arranged to control the first and second current paths to output a current in dependence on the phase-difference between the feedback signal and the reference signal for a first part of the process and to control the first and second current paths to output a current in dependence on an error in the feedback signal caused by the variation of the divisor for a second part of the process.

The control unit may be arranged to control the first and second current paths for the first part of the process such that, when the phase-difference is indicative of the output signal lagging the reference signal, the second current path outputs a current and the first current path does not output a current.

The control unit may be arranged to control the first and second current paths for the first part of the process such that, when the phase-difference is indicative of the output signal leading the reference signal, the first current path outputs a current and the second current path does not output a current.

The control unit may be arranged to, for the first part of the process, control a current path to output a current for a length of time that is dependent on the phase-difference between the output signal and the reference signal.

The control unit may be arranged to control the first and second current paths for the second part of the process such that, if the phase error in the feedback signal has a negative direction, the first current path outputs a current and the second current path does not output a current.

The control unit may be arranged to control the first and second current paths for the second part of the process such that, if the phase error in the feedback signal has a positive direction, the second current path outputs a current and the first current path does not output a current.

The control unit may be arranged to, for the second part of the process, control a current path to output a current having a magnitude that is dependent on the phase error in the feedback signal.

Each current path may comprise a plurality of branches arranged in parallel, each branch comprising a current source and a current control device having two switched nodes, one of which is arranged to receive a current from the current source, and a control node arranged to control a flow of current between the two switched nodes in dependence on a voltage at the control node.

The control unit may be arranged to, for the first part of the process, control all of the branches of one of the current paths to output a current for a length of time that is dependent on the phase-difference between the reference signal and the feedback signal.

The control unit may be arranged to, for the second part of the process, control a number of the branches of one of the current paths that is dependent on the phase error in the feedback signal to output a current for a predetermined length of time.

The phase-locked loop may be arranged to iteratively control the branches to output a current and to change the branches contained in the first and second current paths between successive iterations.

Figure 5A:
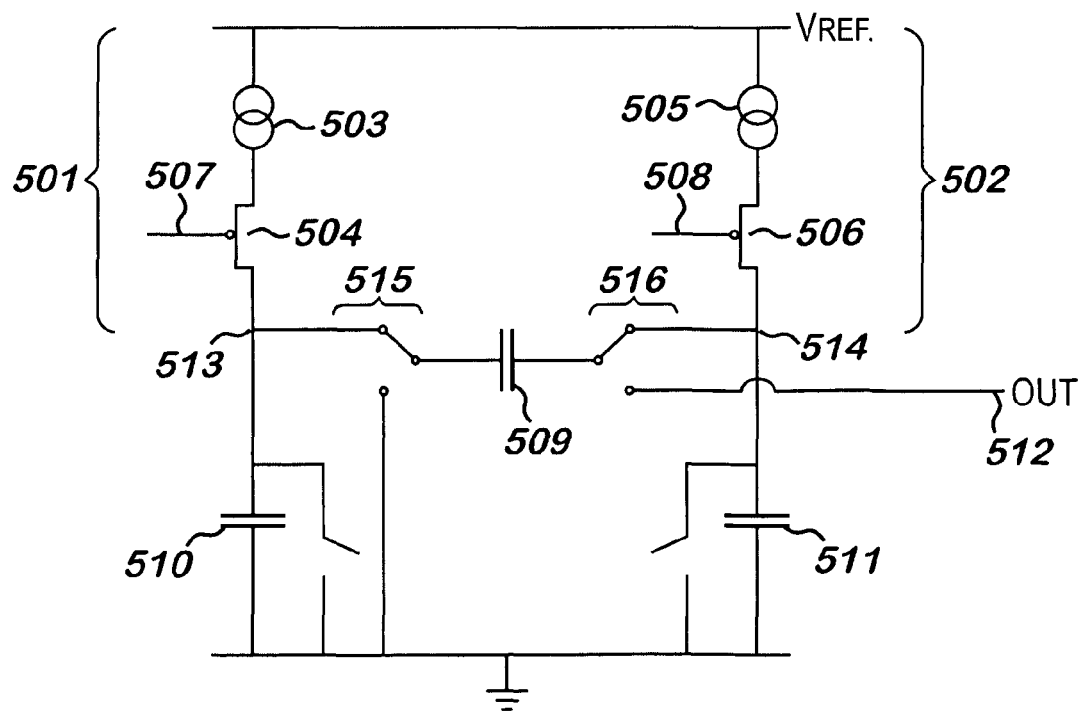
Figure 5B:
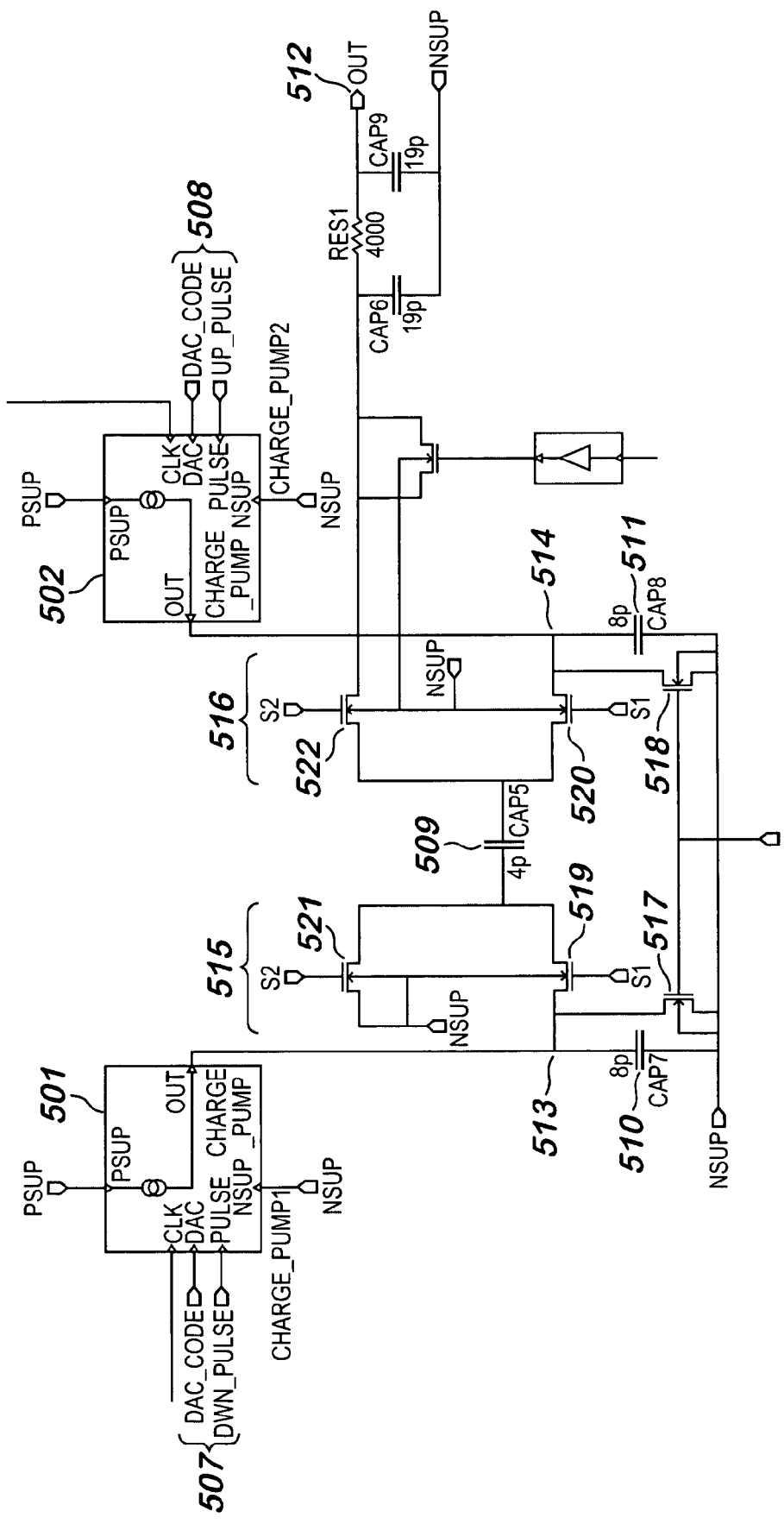
Figure 5C:
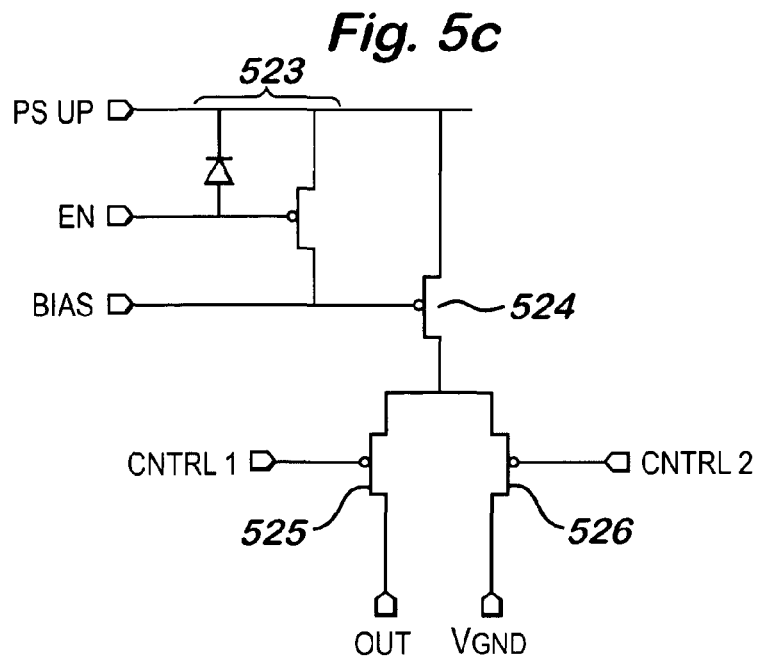
Figure 6A:
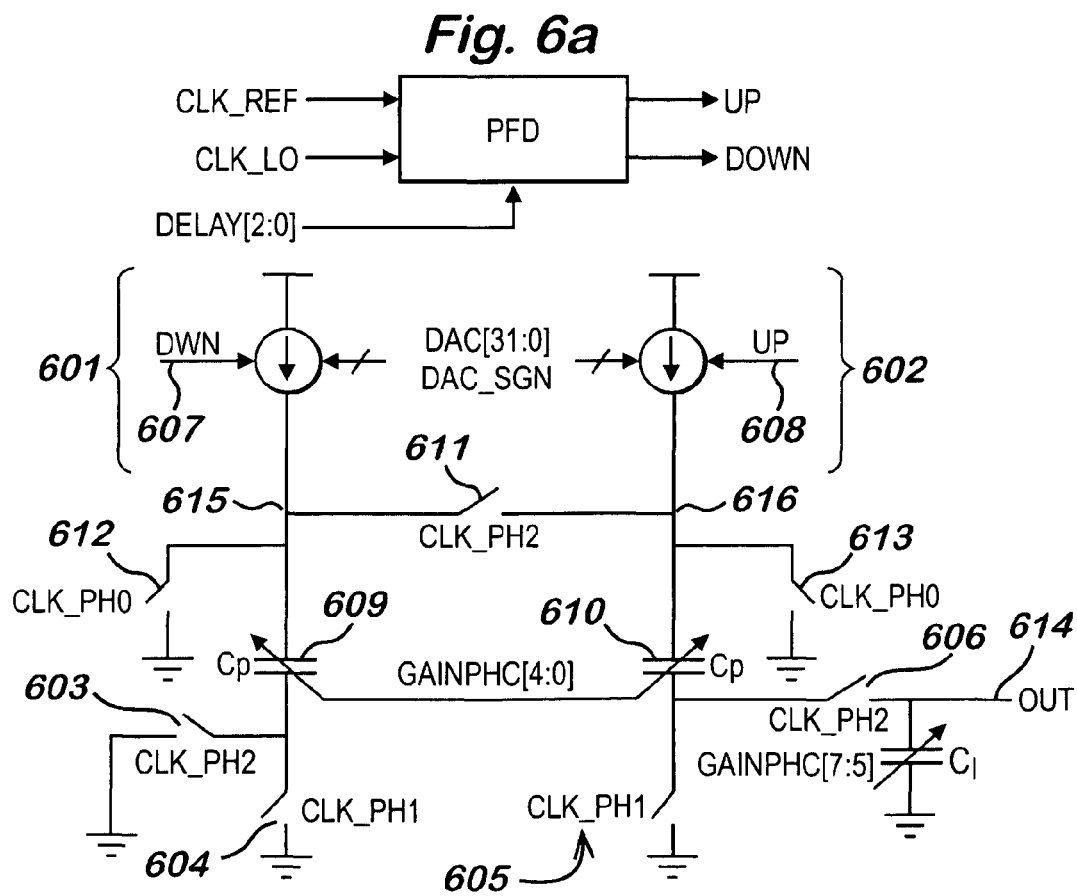
Figure 6B:
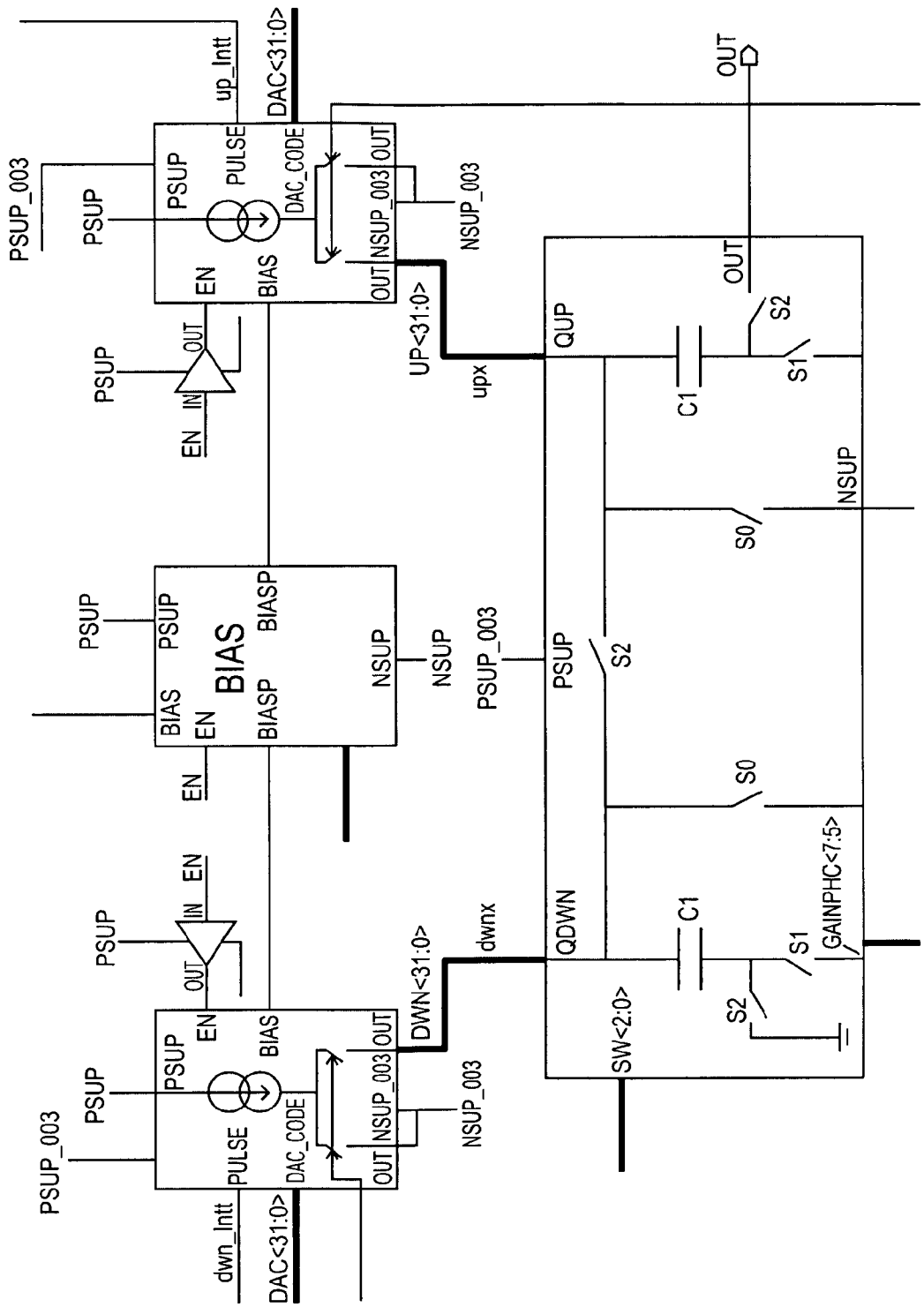

For a better understanding of the present invention, reference is made by way of example to the following drawings, in which:

FIG. 1 shows a phase-locked loop;
FIG. 2 shows the modulation of a division ratio for fractional-N division;
FIG. 3 shows a phase-locked loop incorporating DAC compensation;
FIG. 4 shows a charge pump;
FIGS. 5a to 5c show charge pumps having two transistors of the same polarity;
FIGS. 6a and 6b show charge pumps having improved performance; and
FIG. 7 shows a charge pump having a plurality of current sources.

A charge pump circuit may be connected to another circuit and be arranged to cause a current to flow either into or out of that other circuit. The charge pump may comprise two current paths, each of which may include a current source and a current control device, which may suitably be a transistor. The current control devices may be of the same type so that both are responsive to the same polarity of voltage at their control node to be conducting between their switched nodes.

The charge pump may also include two capacitive plates and a switching arrangement. During a first time period, each capacitive plate may be in communication with a respective one of the current paths so that a current flowing through that current path causes an electrical charge to form on the capacitive plate. During a second time period, one of the capacitive plates may be connected to a reference voltage while the other is connected to an output node of the charge pump. This arrangement may cause the charge formed on the plates during the first time period to be discharged to form a current at the output node.

The term "capacitive plate" refers to the plate of a capacitor but also encompasses any node of a capacitor that can support a charge between itself and another capacitive node.

FIGS. 5a and 5b show examples of charge pumps that generates both "up" and "down" currents by means of transistors of the same polarity. The charge pump shown in FIG. 5b is a specific implementation of the circuit shown in FIG. 5a. The two circuits function in substantially the same way. in both figures the same references are used for components performing the same function in the charge pump.

In FIG. 5a, the charge pump comprises two current paths 501, 502. The first current path comprises current source 503 and current control device 504. The second current path comprises current source 505 and current control device 506. In FIG. 5 the current control devices are provided by PMOS transistors. The transistors are controlled by voltages applied to their respective control nodes 507, 508. The charge pump also comprises a capacitive element 509. The charge pump is shown during the first time period, so that the capacitive element has one plate communicating with the first current path and one plate communicating with the second current path. The currents output by each current path are received by capacitors 510, 511 and cause a voltage change at nodes 513, 514. This voltage change causes an electrical charge to form on the plates of the capacitor, which is transferred to the loop filter during the second time period by connecting one plate to circuit ground and the other plate to an output node 512. The charge pump comprises switching arrangements 515, 516 that control the connections of the capacitive element in the first and second time periods.

The capacitors 510, 511 are shown connected between the current paths and a reference voltage. However, the capacitors may be connected to different reference voltages. Similarly, both current sources 503, 505 are shown connected to the same reference voltage. However, the current sources may be connected to different reference voltages.

FIG. 5b shows an example of a specific implementation of the charge pump shown generally in FIG. 5a. The charge pump shown in FIG. 5b comprises two current paths 501, 502. Each current path includes a current source and a current control device as shown in FIG. 5c. in FIG. 5c, the current source is shown at 523 and the current control device is provided by PMOS transistor 524. Two further transistors 525, 526 act as switches so that a current output by the current source when transistor 524 is conducting can be connected either to the remainder of the charge pump or to virtual ground. The operation of transistors 525, 526 may be controlled by control signals generated by a control unit.

The charge pump of FIG. 5b also includes a capacitive element 509 and switching arrangements 515, 516, which in the circuit of FIG. 5b are implemented by transistors 519 to 522. Further transistors 517, 518 are provided for discharging capacitors 510, 511 during the second time period.

As in the circuit shown in FIG. 4, one objective of the circuits of FIGS. 5a and 5b is to provide a charge pump that can provide a current in two directions, i.e. a charge pump that can cause a current to flow either into or out of a circuit connected to the output node of the charge pump. In FIGS. 5a and 5b, current path 501 may be arranged to provide a "down" current (i.e. a current flowing out of a circuit connected to the output node) while current path 502 can be arranged to provide an "up" current (i.e. a current flowing into a circuit connected to the output node of the charge pump). The arrangement of the charge pump shown in FIGS. 5a and 5b may be advantageous because the two different current directions can be achieved by means of current control devices of the same polarity (i.e. the PMOS transistors 503, 505). Therefore, the transient response of both transistors can be more closely matched than when transistors of different polarity are used.

The operation of both circuits is as follows:

During a first time period, the respective current sources of each current path may generate a current. The amount of charge that flows through each of the current paths during the first time period is dependent on the size of the current generated by each current source and the length of time for which that current is generated. These parameters are typically controlled by control inputs 507, 508.

The control signals input into the current sources during the first time period will typically be controlled so that a suitable amount of charge can be injected into a circuit connected to the output node of the charge pump. In a phase-locked loop, these control signals may be dependent on a phase difference between a feedback signal and a reference signal and/or on an error introduced into the system by modulating a division ratio. In FIG. 5b it can be seen that two control signals are input into each current source: DAC and pulse. The pulse input may control the current source in dependence on the phase difference between the feedback signal and the reference signal while the DAC input may be used to compensate for the modulated division ratio.

The pulse input may typically be used to cause the current source to generate a predetermined current for a length of time that is dependent on the phase difference between the feedback signal and the reference signal. The length of time may be proportional to the phase-difference between the reference signal and the feedback signal. The DAC input may typically be used to cause the current source to generate for a predetermined length of time a current that is dependent on a modulated division ratio. This predetermined length of time may be one period of the signal output by a phase-locked loop. The magnitude of the current may be proportional to the phase error. These two different types of compensation may lead to a two-stage current generation process, with e.g. phase compensation being performed first followed by DAC compensation. This will be described in more detail later.

The phase-locked loop may comprise a control unit for generating the control signals input into the current sources. This circuitry may be implemented wholly in hardware or may incorporate a processor running under software control.

The flow of current through each respective current path is controlled by the degree to which the transistors that control the flow of current in each current path are conducting between their drain and source terminals. This is determined by a control signal applied to the gate terminal of the transistors. In FIGS. 5a and 5b, both of the transistors are PMOS transistors and therefore both become conducting when a logic zero is applied to their gate terminal. Because both transistors are PMOS transistors, they may be controlled using the same control signal, e.g. by using an arrangement such as that shown in FIG. 5c. If the same control signal is used (and if both transistors have the same dimensions, doping levels etc) then both transistors should always be conducting to substantially the same extent. A charge pump that controls an output current by controlling the same polarity of transistor a1 may therefore offer significant noise advantages over charge pumps that use transistors of different polarities to control the current flow. If the same control signal is used for all of the current control devices, a current path from which a current is not wanted (e.g. the "up" path because only a "down" pulse is to be generated) can be diverted to virtual ground using a switching arrangement such as that shown in FIG. 5c.

The capacitor 509 is connectable to the current paths via switching arrangements 515 and 516. The switching arrangements shown in FIG. 5b each comprise two transistors acting as voltage-controlled switches so that the capacitor is alternately connectable to either the two current paths or to the output node of the charge pump. Each of the transistors in the switching arrangement is controlled by a respective control signal. As shown in FIG. 5b, each switching arrangement includes one NMOS transistor controlled by signal S1 and another NMOS transistor controlled by signal S2.

During the first time period, S1 is high while S2 is low so that transistors 519 and 520 are conducting while transistors 521 and 522 are non-conducting. Therefore, during the first time period, each plate of the capacitor is connected to a respective one of the current paths. if one or both of these paths is carrying a current during the first time period, this current causes an electrical charge to form on the plate of the capacitor connected to that path.

During the second time period, S2 is high while S1 is low so that transistors 519 and 520 are non-conducting while PMOS transistors 521 and 522 are conducting. Therefore, during the second time period the capacitor is isolated from the two current paths. During the second time period, one plate of the capacitor may be connected to a reference voltage via transistor 521 while the other plate of the capacitor is connected to the output node 512 of the charge pump via transistor 522. Therefore, the electrical charge that has accumulated on the plates of the capacitor during the first time period is transferred to the loop filter during the second time period. This causes a current to be generated at the output of the charge pump.

During the second time period, electrical charge built-up during the first time period on one of the capacitor's plates will tend to discharge in the opposite direction from electrical charge built-up on the other plate. Therefore, because current flowing through one of the current paths causes an electrical charge to build up on a different plate of the capacitor from current flowing in the same direction through the other current path, one path (502) is effectively capable of causing a current to flow into the output node while the other path (501) is effectively capable of causing a current to flow out of the output node.

A current may flow through only one of the two current paths during the first time period. Typically both transistors will be conducting if the arrangement of FIG. 5c is used (since both receive the same control signal) so that whether or not a current is output by a particular current path is controlled by the switching arrangement provided by transistors 525, 526. Alternatively both current paths may have a current flowing through them during the first time period (which again may be controlled by the switching arrangement provided by transistors 525, 526), causing an electrical charge to be built-up on both of the capacitor plates. During the second time period, these charges effectively discharge in opposite directions, so that the current output by the charge pump is representative of the difference between the currents that flowed through the first and second current paths during the first time period.

As mentioned above, the charge pump may perform both DAC and PFD compensation, in which case the charge pump may suitably be arranged to perform a two-part compensation process during the first time period. The DAC and PFD compensation may be performed consecutively or may overlap in time. For example, the PFD compensation may be start first to account for any phase difference between the feedback signal and the reference signal, followed by the DAC compensation to compensate for any errors caused by modulating the division ratio. The DAC compensation may always commence a predetermined time after the VCO clock. Depending on the duration of the PFD compensation pulse, the DAC compensation may commence before the PFD compensation has completed. This overlap may require each current path to have more than one current source (see later). Electrical charge accumulates on the capacitor plates during the two-part compensation process such that, at the end of the process, the electrical charge on each plate is the sum of the charges formed on that plate during both parts of the process. Therefore, the current output by the charge pump during the second time period will be representative of both the DAC and PFD compensation.

The circuits of FIGS. 5a and 5b therefore provide a charge pump that is able to provide an output current in two directions by means of transistors of the same polarity. Therefore, these circuits do not suffer from the problem of conventional charge pumps of not being able to match the transient behaviour of NMOS and PMOS transistors.

A further advantage of the circuit shown in FIGS. 5a and 5b is that when both DAC and PFD compensation are performed, only the difference between the two currents is transferred to the output node and hence to the loop filter of the phase-locked loop. This is advantageous because the PFD compensation is typically performed by generating a current pulse of predetermined size but variable length while the DAC compensation is typically performed by generating a current pulse of predetermined length but variable size.

Therefore, although the error between the two signals averages to zero, the difference between the current pulse shapes for the two types of compensation can tend to create instantaneous noise in the phase-locked loop. Transferring a current that is dependent on the difference between the total charge generated during the PFD and DAC compensation phases reduces noise caused by temporal mismatch in the current pulses generated by the DAC and PFD compensation units.

One potential problem with the circuit shown in FIGS. 5a and 5b is that the parasitic capacitance of capacitor 509 can cause noise. A circuit that may address this problem is shown in FIG. 6a.

FIGS. 6a and 6b also show examples of charge pumps that generates both "up" and "down" currents by means of transistors of the same polarity. The charge pump shown in FIG. 6b is a specific implementation of the circuit shown in FIG. 6a. The two circuits function in substantially the same way. In both figures the same references are used for components performing the same function in the charge pump.

In FIG. 6a, the charge pump comprises two current paths 601, 602. Each current path may comprise a current source and current control device. The current control devices may be provided by PMOS transistors. The current paths are controlled by voltages applied to their respective control nodes 607, 608. The charge pump also comprises a capacitive element provided by capacitors 609 and 610. During the first time period, the capacitive element has one plate in capacitor 609 communicating with the first current path and one plate in capacitor 610 communicating with the second current path. Switches 604 and 605 are closed so that the currents output by each current path are received by capacitors 609, 610 and cause an electrical charge to build up across the capacitors. This electrical charge is discharged during the second time period by connecting both capacitors together via switch 611 to effectively form a single capacitor with one plate connected to circuit ground via switch 603 and the other plate connected to an output node 614 via switch 606. The capacitors may be briefly reset via switches 612, 613 after they have been discharged into the output node to ensure that they are completely discharged before a new charging process is begun.

FIG. 6b shows a specific implementation of a circuit that functions in substantially the same way as the circuit shown in FIG. 6a. The circuit of FIG. 6b also comprises two current paths, each having a current source and a current control device. These may be arranged in a simple series arrangement such as that shown in FIG. 5a or in a more complex arrangement such as that shown in FIG. 5c.

The circuits of FIGS. 6a and 6b differ from that of FIGS. 5a and 5b in that a capacitor is connected to each current path. The operation of the circuits in FIGS. 6a and 6b is similar to that of the circuits in FIGS. 5a and 5b, in that during a first time period a current flowing through the current paths causes an electrical charge to form on one or more capacitive plates, the electrical charge then being discharged during a second time period. However, the principle of operation is slightly different. In the circuits of FIGS. 5a and 5b, a current output by one of the current paths causes a voltage drop at the node to which the capacitor is connected, thereby causing an electrical charge to form on the plate of the capacitor. in the circuit of FIGS. 6a and 6b, a current output by one of the current paths flows through one of the capacitors and thereby causes an electrical charge to build-up on the plates of that capacitor.

The switching sequence for the circuit of FIG. 6b is as follows. First, switches S2 are open and switches S1 and S0 are closed so that any residual charge stored on capacitors C1 can be discharged. Then switches S0 and S2 are open and switches S1 are closed, so that current can flow through the first and second current paths and cause an electrical charge to form on the plates of the capacitors. Finally, switches S0 and S1 are open and switches S2 are closed. The two capacitors are thus connected together with a first plate of the complete capacitive element being connected to a reference voltage (circuit ground in the figure) and a second plate of the capacitive element being connected to the output node of the charge pump.

Each of switches S0, S1 and S2 in FIG. 6 may be implemented by transistors.

The circuits of FIGS. 6a and 6b therefore provide similar advantages to the circuits of FIGS. 5a and 5b but offers improved performance. One advantage is that the arrangement of the capacitive element in the circuits of FIGS. 6a and 6b suffers less from parasitic capacitance than the circuits of FIGS. 5a and 5b. Therefore, this capacitive arrangement may be advantageous from a noise perspective. Another advantage is that the circuits of FIGS. 6a and 6b provide a higher dynamic range than the circuits of FIGS. 5a and 5b. A further advantage is that the circuits of FIGS. 6a and 6b have a lower on-chip capacitance than the circuits of FIGS. 5a and 5b.

A further advantage of the circuits shown in FIGS. 6a and 6b is that the voltage swings at the nodes 615 and 616 are relatively small, which means that the current sources can be made very linear.

The current control devices described herein are not limited to transistors but may be any type of current control device having a polarity that affects its behaviour. Similarly, although the transistors referred to herein have mainly been PMOS transistors, this is for the purposes of example only and any type or polarity of transistor may be used. However, PMOS transistors may offer noise benefits over other types of transistor.

The current paths shown in FIGS. 5a, 5b, 6a and 6b may comprise a plurality of individual current branches, each comprising a current source and a current control device. The current output by a current path may be the sum of the currents generated by the plurality of current branches belonging to that path. An example of such a circuit is shown in FIG. 7.

FIG. 7 shows a control unit 703 that is arranged to receive input signals from first and second comparison units 701, 702. The first comparison unit may suitably be a phase-frequency detector that is arranged to detect a phase difference between the reference signal and the feedback signal of a phase-locked loop. The second comparison unit may suitably be arranged to generate a control signal for the control unit in dependence on the modulation of the division ratio in the feedback loop of a phase-locked loop. The second comparison unit may also incorporate a phase-frequency detector (which may be the phase-frequency detector of the first comparison unit) to enable it to determine the current required to compensate for the modulation of the division ratio. The control unit controls the operation of a group of current branches 704 in dependence on the signals received from the comparison units. Each current branch may comprise a current source and a current control device as shown in FIGS. 5a and 6a or FIG. 5c. The control unit can then control a current output by each of the current branches by controlling the voltage at the control node of the current control device in each branch.

The current branches generate a current in dependence on control signals received from the control unit. If the current branches are arranged as shown in FIG. 5c, the same control signal may be used to provide the control voltage for all of the current control devices. The sum of the currents generated by the current sources is received by a summation unit 707, which may suitably be a capacitive element. The summation unit generates the output signal 708, which may be for injecting charge into a loop filter of a phase-locked loop.

The control unit may control the current sources to generate the required currents during a first time period. During this first time period, the currents generated by the individual current sources are received by the summation unit. During the second time period, the summation unit forms an output current that is dependent on the currents it received during the first time period. It can be seen that this corresponds to the first and second time periods that were described with reference to FIGS. 5a, 5b, 6a and 6b.

By comparing FIG. 7 with FIGS. 5a, 5b, 6a and 6b, it can be seen that the summation unit may be provided by the capacitive arrangements shown in FIGS. 5a, 5b, 6a and 6b. The current paths shown in FIGS. 5 and 6 can be considered to represent a plurality of current branches arranged in parallel, so that each of the capacitive plates may be in communication a plurality of current branches during the first time period.

The current branches may be arranged into two groups 705, 706. A first group 705 may be arranged to generate "up" current pulses. A second group 706 may be arranged to generate "down" current pulses. Often PFD and DAC compensation requires that current pulses be generated in opposite directions, particularly in the locked condition when theoretically the phase-difference between the reference and feedback signals is equal to the phase error caused by modulating the division ratio. Therefore, it will frequently occur that one group of current sources will used to generate the current pulses for PFD compensation followed by the other group of current sources generating pulses for DAC compensation.

The control unit may be arranged to alter the current sources it uses for PFD compensation and DAC compensation from one time period to the next so that the current sources are rotated, either individually or in a block, between the first and second groups. This rotation helps to reduce noise because it enables any errors in the PFD or DAC compensation caused by individual ones of the current sources to be evened out over time.

The control unit may be arranged to control the current branches such that a two-part compensation process is performed. PFD compensation and DAC compensation may be performed separately (e.g. consecutively). However, the two parts of the process may overlap in time. The first group of current sources may first be controlled to generate a current dependent on the signal received from the first comparison unit. A predetermined time after the VCO clock, the second group of current sources may be controlled to generate a current in dependence on the signal received from the second comparison unit. If the first group of current sources is still generating current as the second group of current sources starts to generate current, the two currents will be received concurrently by the summation unit. These two current generation processes may be non-overlapping in time. However, it may be that two forms of compensation can overlap in time even when the same charge pump is used provided that different current branches are used for each form of compensation.

Typically, PFD compensation may be performed by generating current pulses of predetermined value but variable duration. Therefore, the control unit may be arranged to perform PFD compensation by controlling a predetermined or fixed number of the current sources (e.g. all of the current sources in the first or second group) to generate a current for a length of time that is dependent on the signal received from the phase-frequency detector.

Commonly, when the feedback signal lags the reference signal it is necessary to inject charge into the loop filter of the phase-locked loop and when the feedback signal leads the reference signal it is necessary to remove charge from the loop filter. This can be achieved by generating an output current that flows either into or out of the node connected to the charge pump. If the summation unit is provided by a capacitive arrangement similar to those shown in FIGS. 5a, 5b, 6a and 6b, the required currents can be generated by causing current to flow through either the first current path or the second current path. Therefore, if the feedback signal lags the reference signal, the control unit may cause the current branches of the second current path to generate a current during the first time period so that a current flows out of the output node and into the loop filter during the second time period. Similarly, if the feedback signal leads the reference signal, the control unit may cause the current branches of the second current path to generate a current during the first time period so that a current flows into the output node and out of the loop filter during the second time period.

Typically, DAC compensation may be performed by generating current pulses of predetermined or fixed duration but variable value. Therefore, the control unit may be arranged to perform DAC compensation by controlling a number of current sources to generate current for a predetermined or fixed length of time. The predetermined length of time may be one period of the VCO output signal. The number of current sources arranged to generate a current may be dependent on the signal received from the DAC compensation unit. A variable current may also be achieved by the control unit controlling current control devices in the summation unit, e.g. by setting the control voltage applied to the gate terminals of transistors 503 and 505 in FIG. 5a and transistors 603 and 605 in FIG. 6a.

In a similar way to PFD compensation, DAC compensation can require charge to be either injected or removed from the loop filter. This is dependent on the direction of the phase error. When the phase error is in a positive direction, it is generally necessary to inject charge into the loop filter. This is because a positive phase error will either cause a feedback signal lagging the reference signal to appear to lag less than it should, so that not enough charge would be injected into the loop filter by PFD compensation alone, or cause a feedback signal leading the reference signal to appear to lead more than it should, so that too much charge would be removed from the loop filter by PFD compensation alone. A positive phase error is therefore compensated for by injecting charge proportional to the error into the loop filter. This may be achieved by having the second current path outputting a current rather than the first current path. Similarly, a phase error in the negative direction requires charge to be removed from the loop filter. This may be achieved by having the first current path outputting a current rather than the second current path. When the phase-locked loop is locked, the phase error should be equal in magnitude but opposite direction to the phase-difference between the reference signal and the feedback signal.

In one embodiment, the control unit may comprise a demultiplexor for controlling the DAC current branches. A DAC code received by the control means, or generated by the control means from information received from the divider, may be input into the demultiplexor to activate the required number of current branches for a predetermined length of time. The activated branches may be those which are connected to the rest of the charge pump, with the unactivated current branches outputting their current to virtual ground. The control unit may also comprise control lines for activating the PFD current branches for a length of time dependent on the length of time for which an output of the phase-frequency detector has a predetermined logic level. The control unit may also comprise a switching arrangement for "rotating" the current branches between the DAC and PFD groups at each clock period.

A current source may be used either for PFD compensation or for DAC compensation. The number of current sources used for each type of compensation may be the same or may be different. The current sources may be physically arranged in an interleaved way such that, in an arrangement of parallel current sources, each alternate current source is used for PFD compensation with the other current sources being used for DAC compensation (i.e. a parallel arrangement: A B A B . . . ; with "A" current sources being used for PFD compensation and "B" current sources being used for DAC compensation).

The overall current that is output by the charge pump may be directly representative of an overall error in the output signal of the phase-locked loop relative to the reference signal. This is because the phase-locked loop described herein is not arranged to form an output signal having a fixed, permanent phase offset relative to the reference signal. Some phase-locked loops are designed to form an output signal having such a fixed phase offset between the output signal and the reference signal because it enables the phase-error compensation to be always performed in one direction. For example, if a sufficient offset is applied to the output signal then the feedback signal can be made to always lead or lag the reference signal, such that phase-error compensation always involves current pulses either in the "up" direction or in the "down" direction. However, in the charge pump described herein, DAC compensation is performed by generating current pulses in either the "up" or the "down" direction, depending on the direction of the phase-error, so that no such phase offset is required.

The phase-locked loop may be arranged to generate an output signal having a frequency that is a static value times the frequency of the reference signal. However, this static value may be achieved on average by varying the division ratio. The charge provided by the overall current pulse that is output by the charge pump may be proportional to the phase-difference that would have existed between the reference signal and the feedback signal if the feedback signal had been formed by dividing the output signal by the static value and not by the varied divider. Thus, if there were no phase difference between the reference signal and the feedback signal, because the feedback signal contained no error due to the variation of the divisor and the output signal had the correct frequency, the overall current pulse would contain no charge.

The charge pump described above may therefore offer noise advantages over existing charge pumps. The charge pump is also capable of performing both DAC and PFD compensation so that a phase-locked loop need not contain two charge pumps. In addition, both DAC and PFD compensation can be performed using the same transistors as current control devices. Therefore, noise is not incurred by using different transistors, which would inevitably behave slightly differently, for PFD compensation and DAC compensation.

It should be understood that the circuits described and illustrated herein are examples only and the invention is not limited to any specific implementation of charge pump or phase-locked loop.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The invention claimed is:

1. A charge pump circuit for connection to another circuit via an output node of the charge pump and for causing a current to flow either into or out of the other circuit via the output node in dependence on a current output by first and second current paths in the charge pump, each current path comprising:
   a current source; and
   a current control device having two switched nodes, one of which is arranged to receive a current from the current source, and a control node arranged to control a current flow between the two switched nodes in dependence on a voltage at the control node, the current control devices of the first and second paths being of the same type such that they are responsive to the same polarity of voltage at their control node to be conducting between their switched nodes;
   the charge pump further comprising:
   a capacitive element having first and second capacitive plates; and
   a switching arrangement arranged such that, during a first time period, the first and second capacitive plates are each in communication with a respective one of the current paths, whereby a current output by the first current path causes an electrical charge to be formed on the first capacitive plate and a current output by the second current path causes an electrical charge to be formed on the second capacitive plate, and during a second time period, the first and second capacitive plates are connected to a reference voltage and the output node respectively, the electrical charge formed on the first and second capacitive plates during the first time period thereby being discharged to form a current at the output node.

2. A charge pump as claimed in claim 1, wherein the capacitive element is arranged such that, during the second time period, the electrical charge formed on the first capacitive plate discharges in one direction relative to the output node and the electrical charge formed on the second capacitive plate discharges in the opposite direction relative to the output node.

3. A charge pump as claimed in claim 1, wherein the capacitive element is connected between the first and second current paths such that, during the first time period, a current output by the first current path causes a voltage change at the other of the switched nodes of the current control device of the first path that causes an electrical charge to form on the first capacitive plate and a current output by the second current path causes a voltage change at the other of the switched nodes of the current control device of the second path that causes an electrical charge to form on the second capacitive plate.

4. A charge pump as claimed in claim 3, wherein the capacitive element is a capacitor arranged such that, during the first time period, one plate of the capacitor is connected to the other of the switched nodes of the current control device of the first current path and the other plate of the capacitor is connected to the other of the switched nodes of the current control device of the second current path.

5. A charge pump as claimed in claim 1, wherein the capacitive element comprises two capacitive devices, one connected to the first current path and the other connected to the second current path such that, when a current is output by one of the current paths, it is received by the capacitive device connected to that current path and causes an electrical charge to form on a plate of that device.

6. A charge pump as claimed in claim 5, wherein the capacitive element comprises a switch arranged such that, during the first time period, the capacitive devices are not connected to each other and, during the second time period, the capacitive devices are connected to each other.

7. A charge pump as claimed in claim 5, wherein the capacitive devices are capacitors, each having one plate connected to the other of the switched nodes of the current control device of its respective current path and the other plate connected to a reference voltage.

8. A charge pump as claimed in claim 1, wherein the control nodes of the current control devices are arranged to receive the same control signal.

9. A charge pump as claimed in claim 1, wherein the current control devices are transistors.

10. A charge pump as claimed in claim 1, wherein the current control devices are PMOS transistors.

11. A phase-locked loop for generating an output signal of a predetermined frequency, the phase-locked loop comprising a charge pump arranged to generate a current in dependence on a phase difference between a signal output by the phase-locked loop and a reference signal, the charge pump being connected to a filter via an output node of the charge pump and being capable of causing a current to flow either into or out of the filter via the output node in dependence on a current output by first and second current paths in the charge pump, each current path comprising:
   a current source; and
   a current control device having two switched nodes, one of which is arranged to receive a current from the current source, and a control node arranged to control a current flow between the two switched nodes in dependence on a voltage at the control node, the current control devices of the first and second paths being of the same type such that they are responsive to the same polarity of voltage at their control node to be conducting between their switched nodes;
   the charge pump further comprising:
   a capacitive element having first and second capacitive plates; and
   a switching arrangement arranged such that, during a first time period, the first and second capacitive plates are each in communication with a respective one of the current paths, whereby a current output by the first current path causes an electrical charge to be formed on the first capacitive plate and a current output by the second current path causes an electrical charge to be formed on the second capacitive plate, and during a second time period, the first and second capacitive plates are connected to a reference voltage and the output node respectively, the electrical charge formed on the first and second capacitive plates during the first time period thereby being discharged to form a current flow at the output node.

12. A phase-locked loop as claimed in claim 11, wherein the phase-locked loop comprises a control unit arranged to control a current output by the first and second current paths by controlling a voltage at the control node of the current control device of each current path.

13. A phase-locked loop as claimed in claim 12, wherein the control unit is arranged to cause a current path to output a current by controlling the voltage at the control node of the current control device of that path to be a voltage at which the current control device of that current path is conducting between its switched nodes.

14. A phase-locked loop as claimed in claim 13, wherein the control means is arranged to control a length of time for which a current path outputs a current by controlling the length of time for which the voltage at the control node of the current control device of that current path is a voltage at which the current control device is conducting.

15. A phase-locked loop as claimed in claim 11, wherein the phase-locked loop comprises a feedback loop arranged to form a feedback signal representative of the output signal for comparison with the reference signal, said feedback loop comprising a divider arranged to receive the output signal of the phase-locked loop and divide the output signal to form the feedback signal, the divider being arranged to vary the divisor by which the output signal is divided.

16. A phase-locked loop as claimed in claim 15, wherein the charge pump is arranged to perform a two-part compensation process during the first time period, the control unit being arranged to control the first and second current paths to output a current in dependence on the phase-difference between the feedback signal and the reference signal for a first part of the process and to control the first and second current paths to output a current in dependence on an error in the feedback signal caused by the variation of the divisor for a second part of the process.

17. A phase-locked loop as claimed in claim 16, wherein the control unit is arranged to control the first and second current paths for the first part of the process such that, when the phase-difference is indicative of the output signal lagging the reference signal, the second current path outputs a current and the first current path does not output a current.

18. A phase-locked loop as claimed in claim 16, wherein the control unit is arranged to control the first and second current paths for the first part of the process such that, when the phase-difference is indicative of the output signal leading the reference signal, the first current path outputs a current and the second current path does not output a current.

19. A phase-locked loop as claimed in claim 17, wherein the control unit is arranged to, for the first part of the process, control a current path to output a current for a length of time that is dependent on the phase-difference between the output signal and the reference signal.

20. A phase-locked loop as claimed in claim 16, wherein the control unit is arranged to control the first and second current paths for the second part of the process such that, if the phase error in the feedback signal has a negative direction, the first current path outputs a current and the second current path does not output a current.

21. A phase-locked loop as claimed in claim 16, wherein the control unit is arranged to control the first and second current paths for the second part of the process such that, if the phase error in the feedback signal has a positive direction, the second current path outputs a current and the first current path does not output a current.

22. A phase-locked loop as claimed in claim 20, wherein the control unit is arranged to, for the second part of the process, control a current path to output a current having a magnitude that is dependent on the phase error in the feedback signal.

23. A phase-locked loop as claimed in claim 19, wherein the each current path comprises a plurality of branches arranged in parallel, each branch comprising:
 a current source; and
 a current control device having two switched nodes, one of which is arranged to receive a current from the current source, and a control node arranged to control a flow of current between the two switched nodes in dependence on a voltage at the control node.

24. A phase-locked loop as claimed in claim 23, wherein the control unit is arranged to, for the first part of the process, control all of the branches of one of the current paths to output a current for a length of time that is dependent on the phase-difference between the reference signal and the feedback signal.

25. A phase-locked loop as claimed in claim 22, wherein the control unit is arranged to, for the second part of the process, control a number of the branches of one of the current paths that is dependent on the phase error in the feedback signal to output a current for a predetermined length of time.

26. A phase-locked loop as claimed in claim 23, wherein the phase-locked loop is arranged to iteratively control the branches to output a current and to change the branches contained in the first and second current paths between successive iterations.

* * * * *